United States Patent [19]

Palara et al.

[11] Patent Number: 4,644,294

[45] Date of Patent: Feb. 17, 1987

[54] DEVICE FOR PROTECTING A PUSH-PULL OUTPUT STAGE AGAINST A SHORT-CIRCUIT BETWEEN THE OUTPUT TERMINAL AND THE POSITIVE POLE OF THE SUPPLY

[75] Inventors: Sergio Palara, Bareggio; Aldo Torazzina, Monza, both of Italy

[73] Assignee: SGS Componenti Elettronici S.p.A., Agrate, Italy

[21] Appl. No.: 693,777

[22] Filed: Jan. 23, 1985

[30] Foreign Application Priority Data

Jan. 23, 1984 [IT] Italy ............................... 19271 A/84

[51] Int. Cl.⁴ ............................................. H03F 1/52
[52] U.S. Cl. .................................... 330/298; 361/56; 361/86; 361/91; 361/101
[58] Field of Search .............. 330/207 P, 298; 361/56, 361/57, 86, 91, 101, 111

[56] References Cited

U.S. PATENT DOCUMENTS

| | | | |
|---|---|---|---|
| 3,544,720 | 12/1970 | Corderman | 330/207 P UX |
| 3,980,930 | 9/1976 | Glogolja | 330/207 P X |
| 4,010,402 | 3/1977 | Miyata | 330/207 P X |
| 4,186,418 | 1/1980 | Seiler | 330/207 P X |
| 4,417,292 | 11/1983 | Borghese et al. | 330/298 X |

Primary Examiner—James B. Mullins
Attorney, Agent, or Firm—Harry M. Weiss & Associates

[57] ABSTRACT

A device for protecting a push-pull output stage ($G_v$) against a short-circuit between the output terminal (A) and the positive pole ($+V_{cc}$) of the supply, comprising a first ($A_1$) and a second ($A_2$) threshold comparator, both having a first input terminal coupled to the output terminal (A) of the output stage and both having a second input terminal coupled to a predetermined voltage reference. The reference potential ($RIF_1$) to which the threshold comparator ($A_1$) is coupled is kept at a potential which is lower than the other reference potential ($RIF_2$) to which threshold comparator ($A_2$) is coupled. The output terminal of the first comparator ($A_2$) is coupled to the activation terminal of a low impedance circuit means (LI) inserted between the output terminal (A) of the output stage and the negative pole ($-V_{cc}$) of the supply. The output terminal of the second comparator ($A_2$) is coupled to an inhibitor terminal of the output power amplifier stage ($G_v$).

5 Claims, 3 Drawing Figures

DEVICE FOR PROTECTING A PUSH-PULL OUTPUT STAGE AGAINST A SHORT-CIRCUIT BETWEEN THE OUTPUT TERMINAL AND THE POSITIVE POLE OF THE SUPPLY

BACKGROUND OF THE INVENTION

1. Field of the Invention

The present invention relates generally to electronic devices for protecting against short-circuit conditions in circuits comprising semiconductor power elements and, more particularly, to protection devices for push-pull output stages designed to protect against short-circuit conditions between an output terminal and a positive pole of the supply.

2. Discussion of the Related Art

Push-pull output stages can, for example, be found in a variety of applications, such as in audio power amplifiers. In general, the requirements for protection devices, when integrated with the circuit to be protected, are that they should be simple and economical, that they should not lead to losses of working power and that they should not limit in any way the dynamic operation of the circuit itself. The circuit diagram of a known protection device, normally used in monolithically integrated amplifier circuits, for protection against a short-circuit condition between the output terminal of the push-pull output stage and the positive pole of the supply, is shown in FIG. 1 of the drawings.

The push-pull output state of FIG. 1 comprises two bipolar power transistors, $T_1$ and $T_2$, both of the n-p-n type, the first transistor $T_1$ having its collector terminal coupled to the positive pole $+V_{cc}$ of a supply voltage generator and the second transistor $T_2$ having its emitter coupled to the negative pole $-V_{cc}$ of the generator. The point A of the coupling between the emitter of transistor $T_1$ and the collector of transistor $T_2$ forms an output terminal of the output stage to which there is coupled, via a capacitive element, a first terminal of a load impedance $R_L$, the second terminal of which is coupled to the negative pole $-V_{cc}$.

The power transistors $T_1$ and $T_2$ are driven to conduct in phase opposition by means of circuit control means (not shown) which are coupled to their base terminals. The protection device comprises a bipolar transistor $T_4$ of the p-n-p type, whose emitter terminal is coupled to the output terminal A and a bipolar transistor $T_6$ of the n-p-n type, whose base terminal is coupled to the collector of the transistor $T_4$ and, via a resistor $R_6$, to the negative pole $-V_{cc}$. The collector terminal and the emitter terminal of the transistor $T_6$ are respectively coupled to the base terminal of the power transistor $T_2$ and to the negative pole $-V_{cc}$. The base terminal of the transistor $T_4$ is coupled to the positive pole $+V_{cc}$, via two series-connected diodes $D_1$ and $D_2$ and to the negative pole via a constant current generator $G_1$. The base terminal of the transistor $T_4$ is therefore coupled to a voltage reference which sets a threshold for the conduction of the transistor. The transistor $T_4$ can only begin to conduct when the output terminal A is brought to a potential lower than that of the potential of the positive pole $+V_{cc}$ by a value almost equal to the base-emitter voltage normally applied to a bipolar transistor in conduction.

Because the power transistor $T_1$ is never caused to conduct in saturation, the transistor $T_4$ can only conduct when there is a short-circuit between the output terminal A and the positive pole $+V_{cc}$ or an output overvoltage. The conduction of the transistor $T_4$ then also causes the conduction of the transistor $T_6$, which cuts off the power transistor $T_2$ thereby protecting the push-pull amplifier output stage.

In fact, if the transistor $T_2$ remained on during the short-circuit, it would be damaged, possibly irreparably, as it would simultaneously be subject to a collector-emitter voltage equal to the supply voltage and to a current flux equal to the maximum short-circuit current.

Naturally, if the short-circuit conditions are discontinued the transistors $T_4$ and $T_6$ are cut off and the output stage automatically resumes normal operation.

A protection device of the type described above operates reliably, with no drawbacks, when the load impedance is of a resistive or capacitative type, but is not suitable for an ohmic-inductive type load constituted, for example, by a loudspeaker controlled by the output stage of an audio amplifier.

In fact, when an inductive load impedance is coupled to the output terminal of a push-pull output stage, the abrupt variations at certain frequencies of the current which flows in this load, induce therein a counter-electromotive force which may raise the value of the potential of the output terminal beyond the value of the potential of the positive pole of the supply.

The protection device described above then comes into operation, although there is no short-circuit, and cuts off the lower power transistor of the output stage while it is conducting normally, thereby increasing the output overvoltage, with a consequent considerable distortion of the wave shape of the output signal.

A need has therefore been felt for a protection circuit for push-pull output stages that can function properly fon an inductive-type load impedance while protecting the push-pull power output stages against short-circuit conditions.

SUMMARY OF THE INVENTION

It is therefore an object of the present invention is to provide a protection device for a push-pull output stage, to protect against a short-circuit between the output terminal and the positive pole of the power supply, which can be used without drawbacks for the correct operation of the output stage itself, whatever the type of load connected thereto.

The aforementioned and other objects are accomplished, according to the present invention, by a first comparator ($A_1$) that compares an output voltage of the push-pull amplifier output stage with a first reference voltage, and when the voltage is exceeded by the output voltage, the first comparator activates a low impedance circuit device in parallel with an output transistor. When the output voltage exceeds a second reference voltage, a second comparator circuit ($A_2$) is activated and disables the push-pull amplifier output stage. The low impedance network is comprised of transistors coupled in parallel with the output power transistor for providing a second path for power disipation under selected output voltage conditions. The low impedance network is controlled by the first comparator circuit, the first comparator circuit including a transistor coupled to a reference voltage. The output power transistors can be disabled by activation of the second comparator, the second comparator including a transistor coupled to a second reference voltage.

These and other features of the invention will be understood upon reading of the following description along with the drawings.

DESCRIPTION OF THE PREFERRED EMBODIMENT

Detailed Description of the Drawings

Figure 1:
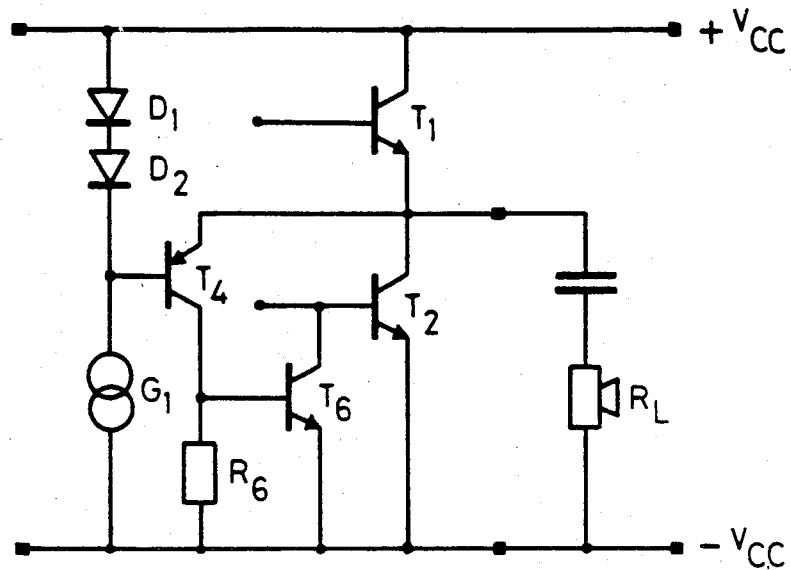
FIG. 1 is a circuit diagram of a push-pull output stage with the known protection device described above.

The same letters and numerals are used in the drawings for corresponding components.

Figure 2:
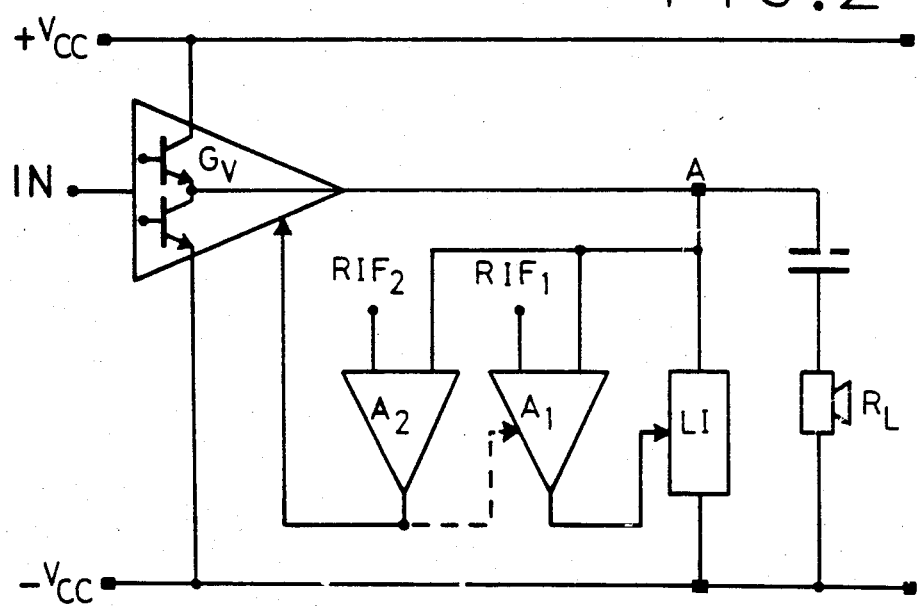
FIG. 2 is a block diagram of a push-pull output stage with a protection device of the invention.

Referring now to FIG. 2, a block $G_v$ representing a push-pull output stage, inserted between the two poles, i.e. the positive pole $+V_{cc}$ and the negative pole $-V_{cc}$ of a supply voltage generator, is shown.

This output stage has an input terminal IN for signals, an inhibitor terminal, coupled to a point of the signal path, and an output terminal A to which is coupled in a capacitative manner a load impedance $R_L$, inserted between the output terminal and the negative pole $-V_{cc}$.

The protection device of the invention, by which means the stage $G_v$ is protected against a short-circuit condition between the output terminal and the positive pole of the supply, comprises a first ($A_1$) and a second ($A_2$) threshold comparator, and a low impedance circuit means LI.

The comparator $A_1$ is designed to generate an output signal only when the potential of the first input terminal exceeds the potential of the second input terminal by a predetermined value. This signal is designed to activate the low impedance circuit means LI which is inserted between the output terminal A of the output stage and the negative pole $-V_{cc}$ of the power supply.

The second threshold comparator $A_2$ has a first and a second input terminal coupled respectively to the output terminal A of the output stage and to a second voltage reference $RIF_2$ and an output terminal coupled to the inhibitor terminal of the output stage.

The comparator $A_2$ is designed to generate an output signal only when the potential of the first input terminal exceeds that of the second input terminal by a predetermined value. This signal is designed to disable the output stage or a part thereof coupled to the inhibitor terminal. The output terminal of the comparator $A_2$ can also be coupled to an inhibitor terminal of the first comparator $A_1$ which is then disabled by the signal generated by the comparator $A_2$ and prevented from generating its own output signal.

This latter coupling is shown in FIG. 2 by a dashed line indicating that it is not indespensable for the correct operation of the protection device.

The predetermined threshold values for the two comparators $A_1$ and $A_2$ and the voltage references to which they are coupled, are determined such that, during normal operation of the output stage, if there is induced in the load impedance, which is of inductive type, a counterelectromotive force caused by current variations such as to raise the potential of the output terminal A towards the potential of the positive pole of the supply, the comparator $A_1$ generates its output signal before the comparator $A_2$. In this way the low impedance circuit means LI is actuated, through which the current, which is produced by the inductance of the load during the transient, can flow directly from the load to the negative pole $-V_{cc}$. This prevents circuit actuation a would otherwise also cause the operation of the comparator $A_2$ with the subsequent undesired blocking of the output stage or of the part coupled to the inhibitor terminal.

The low impedance circuit means LI cannot prevent the operation of the comparator $A_2$ solely in the case of an actual short-circuit between the output terminal A and the positive pole, $+V_{cc}$, of the supply. The output signal of this comparator causes the output stage to be disabled, which stage therefore supports the short-circuit conditions without damage, and possibly also causing the comparator $A_1$ to be disabled.

Figure 3:
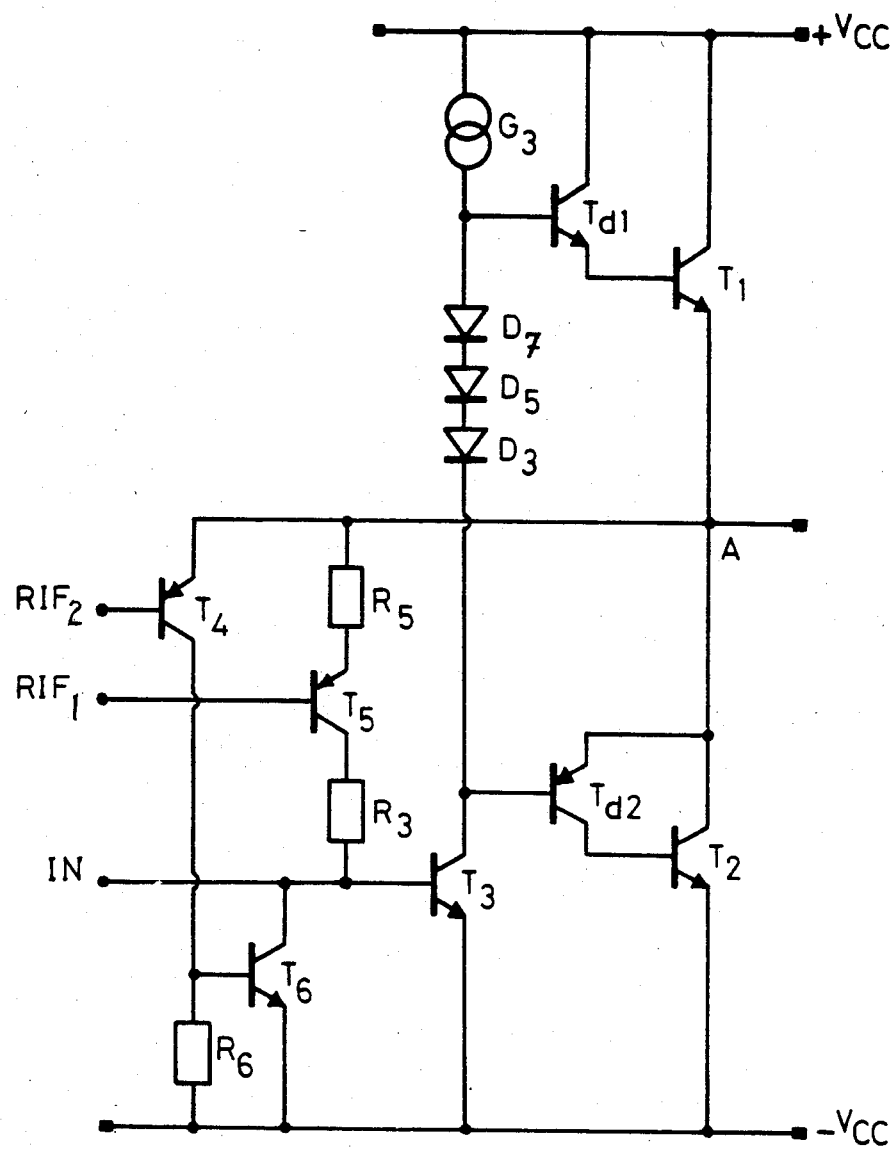
FIG. 3 shows a possible monolithic integrated circuit embodiment of the block diagram of FIG. 2.

FIG. 3 shows a particular circuit embodiment of the block diagram of FIG. 2, which is particularly suitable for monolithic integration, enabling the integration area occupation to be as small as possible.

The push-pull output stage comprises two bipolar power transistors $T_1$ and $T_2$ both of n-p-n type, the first transistor having its collector terminal coupled to the positive pole, $+V_{cc}$, of a supply voltage generator and the second having its emitter terminal coupled to the negative pole, $-V_{cc}$, of the generator.

The coupling point A between the emitter terminal of transistor $T_1$ and the collector terminal of transistor $T_2$ forms the output terminal of the output stage to which there may be coupled a load impedance (not shown).

The base terminal, of the transistors $T_1$ and $T_2$ are respectively coupled to the emitter terminal of a control transistor Td1, of the n-p-n type, and to a control transistor Td2, of the p-n-p type. The collector terminal of the transistor Td1 and the emitter terminal of the transistor Td2 are respectively coupled to the positive pole, $+V_{cc}$, of the power supply and to the collector terminal of the transistor $T_2$. The input signal is supplied to the output stage via an input terminal IN, formed by the base terminal of a transistor $T_3$, of the n-p-n type, whose collector element is coupled to the base terminal of the transistor Td2, while its emitter terminal is coupled to the negative pole, $-V_{cc}$, of the power supply.

The base element of Td1 is also coupled to the collector terminal of transistor $T_3$, via three series-connected diodes $D_3$, $D_5$ and $D_7$, in addition to being coupled to the positive pole, $+V_{cc}$, of the power supply by means of a constant current generator $G_3$.

The point of coupling A, is directly coupled to the emitter transistor of a transistor $T_4$, of the p-n-p type, and is coupled, via a resistor $R_5$, to the emitter terminal of a transistor $T_5$, also of the p-n-p type. The base terminals of the transistors $T_4$ and $T_5$ are coupled to two separate voltage references, $RIF_2$ and $RIF_1$, respectively. The first of these voltage references is at a higher potential than the second voltage reference.

The collector terminal of transistor $T_4$ is coupled to a base terminal of transistor $T_6$, of the n-p-n type, and, via a resistor $R_6$, to the negative pole $-V_{cc}$ of the power supply.

The collector terminal of the transistor $T_5$ is coupled, via resistor $R_3$, to a base terminal of the transistor $T_3$.

The collector terminal and the emitter terminal of transistor $T_6$ are coupled to the base terminal of transistor $T_3$ and to the negative pole, $-V_{cc}$, of the power supply respectively.

The transistor $T_5$, together with the voltage reference $RIF_1$ to which its base element is coupled, form the threshold comparator shown by $A_1$ in the block diagram of FIG. 2.

The transistors $T_3$, $Td_2$ and, in particular $T_2$, included in the output stage to be protected, form the low impedance circuit means LI, without the need for further components.

In the preferred embodiment of the circuit diagram shown in FIG. 3, the voltage supplied to the base terminal of the transistor $T_5$ is kept constant at a value equal to that of the supply voltage less two and a half times the base-emitter votlage normally supplied to a conducting bipolar transistor. The transistor $T_5$ can therefore only begin to conduct when the output terminal A is brought to a potential lower than that of the positive pole, $+V_{cc}$, by, at most, a value equal to one and a half times the base emitter voltage normally supplied to a conducting bipolar transistor.

The transistor $T_4$ together with the voltage reference $RIF_2$, to which its base terminal is coupled, forms the threshold comparator shown by $A_2$ in the block diagram of FIG. 2. The voltage supplied to the base terminal of transistor $T_4$, in the case in which the power transistor $T_1$ is never caused to conduct in staturation, is kept constant at a value equal to that of the supply voltage normally supplied to a conducting bipolar transistor. The transistor $T_4$ can therefore begin to conduct only when the output terminal A is brought to a potential that is lower than that of the positive pole $+V_{cc}$ by at most, a value equal to half the base-emitter voltage normally supplied to a conducting bipolar transistor.

OPERATION OF THE PREFERRED EMBODIMENT

When, during normal operation of the output stage, the load being of an inductive type, an abrupt variation in the current flowing therein causes a counter-electromotive force is induced in the load impedance that tends to bring the potential of the output terminal A to values equal to or greater than those of the potential of the positive pole, $+V_{cc}$, of the power supply. The transistor $T_5$ begins immediately to conduct, activating transistors $T_3$, $Td_2$ and $T_2$ via which the inductance of the load is discharged to the negative pole, $-V_{cc}$, of the power supply. In this way, the potential of the terminal A cannot be brought to values such as to enable the conduction of the transistor $T_4$ and, therefore, has no effect on the correct operation of the output stage.

It should also be noted that this circuit arrangement makes is unnecessary to use a recycling diode that would otherwise be indispensable if the load impedance of an inductive type as the function of this diode is carried out by the power transistor $T_2$.

When, however, a short-circuit between the output terminal and the positive pole of the supply brings the potential of the terminal A to the value of the potential of the positive pole, $+V_{cc}$, of the power supply, the transistor $T_4$ also begins to conduct immediately which, by activating the transistor $T_6$, prevents the transistors $T_3$, $Td_2$ and $T_2$ of the output stage from conducting. In this way, the power transistor $T_2$ is not damaged by the short-circuit conditions.

Whereas the resistor $R_5$ is inserted to prevent self-oscillation, the resistor $R_3$ is designed to limit the collector current of the transistor $T_5$ to a predetermined value, lower than or at maximum equal to the collector current of the transistor $T_6$.

When, therefore, the transistor $T_4$ begins to conduct as a result of the short-circuit, the action of the transistor $T_5$ is automatically cancelled. In practice, the comparator $A_1$ is disabled by means of the output signal of the comparator $A_2$. Naturally, when the short-circuit conditions are removed, the transistor $T_4$ is cut off, so that the output stage can return to normal operation.

An output stage having a bridge configuration and comprising two identical push-pull transistor sections, each of the type described above can also be protected against an output short-circuit condition to the positive pole of the supply. A protection device of the invention is provided for each of these sections in the manner shown in FIGS. 2 and 3. However, in this case the output terminal of the second threshold comparator $A_2$, included in each of the two protection devices, is coupled to both inhibitor terminals of the two output stages. The voltage references can be common.

The foregoing description is intended to illustrate the operation of the preferred embodiment and is not means to limit the scope of the invention. The scope of the invention is to be limited only by the following claims. From the foregoing description, many variations will be apparent to one skilled in the art that would yet be encomppassed by the spirit and scope of the invention.

What is claimed is:

1. A device for protecting a push-pull output stage ($G_v$) against a short-circuit between the output terminal (A) of this output stage and the pole having a higher potential ($+V_{cc}$) of a supply voltage generator between the two poles of which the output stage is inserted, the output stage having an input terminal for coupling to a signal generator and an inhibitor terminal, characterized in that it comprises:

a first ($A_1$) and a second ($A_2$) threshold comparator each having a first and a second input terminal and an output terminal, the first input terminal of both the comparators being coupled to the output terminal (A) of the output stage, the second input terminal of the first comparator ($A_1$) and the second input terminal of the second comparator ($A_2$) being respectively coupled to a first ($RIF_1$) and a second ($RIF_2$) voltage reference, the threshold of each of the two comparators being adjusted such that each comparator generates an output signal only when the potential of the first input terminal exceeds by a predetermined value the potential of the second input terminal, these voltage references and comparator thresholds being predetermined such that the first comparator ($A_1$) begins to generate an output signal at a potential value at the output terminal (A) of the output stage ($G_v$) which is lower than that at which the second comprator ($A_2$) begins to generate an output signal, and comprises a low impedance circuit means (LI) which is inserted between the output terminal (A) of the output stage and the pole having a lower potential ($-V_{cc}$) of the supply voltage generator and has an actuation terminal to which there is coupled the output terminal of the first comparator ($A_1$), the output terminal of the second comparator ($A_2$) being coupled to the inhibitor terminal of the output stage ($G_v$).

2. A protection device as claimed in claim 1, characterized in that the first comparator ($A_1$) has an inhibitor terminal which is coupled to the output terminal of the second comparator ($A_2$).

3. A protection device as claimed in claim 1 characterized in that the low impedance circuit means (LI) is formed by at least one transistor ($T_2$) having a first and a second terminal and a control terminal, the first and second terminals of the transistor being inserted between the output terminal (A) of the output stage ($G_v$) and the pole having a lower potential ($-V_{cc}$) of the supply voltage generator, the control terminal of transistor ($T_2$) being coupled to the output terminal of the first threshold comparator ($A_1$).

4. A protection device as claimed in claim 1, characterised in that the low impedance circuit means (LI) is formed by an output power transistor ($T_2$) included in the output stage ($G_v$) and inserted between the output terminal (A) and the pole having a lower potential ($-V_{cc}$) of the supply voltage generator.

5. Apparatus for use with output power transistors coupled in a push-pull amplifier circuit configuration comprising:

first comparator means for providing an output signal in response to an output signal of said push-pull circuit configuration exceeding a first reference voltage;

impedance means coupled to one of said power transistors for enabling a low impedance circuit in parallel with said one of said output power transistors in response to said first comparator means output signal;

second comparator means for providing a second output signal in response to an output signal of said push-pull circuit configuration exceeding a second reference voltage, said first reference voltage being lower than said second reference voltage, said second signal disabling said output power transistors, said second comparator means includes a p-n-p type transistor coupled to said second reference voltage and to an output terminal of said push-pull circuit, wherein said output power transistors are disabled when a voltage at said output terminal exceeds a predetermined value.

* * * * *